(12) United States Patent
Werner et al.

(10) Patent No.: US 7,763,547 B2
(45) Date of Patent: Jul. 27, 2010

(54) TECHNIQUE FOR ENHANCING PROCESS FLEXIBILITY DURING THE FORMATION OF VIAS AND TRENCHES IN LOW-K INTERLAYER DIELECTRICS

(75) Inventors: Thomas Werner, Reichenberg (DE); Matthias Schaller, Dresden (DE); Massud Aminpur, Crolles (FR)

(73) Assignee: GlobalFoundries Inc., Grand Cayman (KY)

( * ) Notice: Subject to any disclaimer, the term of this patent is extended or adjusted under 35 U.S.C. 154(b) by 607 days.

(21) Appl. No.: 11/199,526

(22) Filed: Aug. 8, 2005

(65) Prior Publication Data

US 2006/0172525 A1  Aug. 3, 2006

(30) Foreign Application Priority Data

Jan. 31, 2005  (DE)  ........................ 10 2005 004 409

(51) Int. Cl.
*H01L 21/3065* (2006.01)
*H01L 21/302* (2006.01)

(52) U.S. Cl. ............... 438/714; 438/740; 257/E21.218; 257/E21.312

(58) Field of Classification Search ......... 438/704–707, 438/712, 713, 723, 734, 740, 689, 694, 700, 438/710–711, 714, 735, 744, 757; 257/E21.218, 257/E21.222, E21.245, E21.252–E21.253, 257/E21.256, E21.31–E21.312
See application file for complete search history.

(56) References Cited

U.S. PATENT DOCUMENTS

| | | | | |
|---|---|---|---|---|
| 6,020,254 A * | 2/2000 | Taguwa | ...................... | 438/618 |
| 6,083,822 A * | 7/2000 | Lee | ............................. | 438/624 |
| 6,232,219 B1 * | 5/2001 | Blalock et al. | .............. | 438/637 |
| 6,576,547 B2 * | 6/2003 | Li | ............................... | 438/637 |
| 6,617,232 B2 * | 9/2003 | Kim et al. | .................... | 438/597 |
| 6,632,746 B2 * | 10/2003 | Kanegae et al. | ............. | 438/706 |
| 6,734,110 B1 | 5/2004 | Jang et al. | .................... | 438/706 |
| 6,943,120 B1 * | 9/2005 | Huang et al. | ................. | 438/713 |
| 6,972,258 B2 * | 12/2005 | Chu et al. | .................... | 438/689 |
| 7,119,009 B2 * | 10/2006 | Watanabe et al. | ........... | 438/624 |
| 7,259,091 B2 * | 8/2007 | Schuehrer et al. | ........... | 438/627 |
| 7,309,654 B2 * | 12/2007 | Schaller et al. | ............. | 438/700 |
| 7,402,523 B2 * | 7/2008 | Nishimura et al. | .......... | 438/704 |
| 7,611,991 B2 * | 11/2009 | Richter et al. | ............... | 438/687 |
| 2002/0039843 A1 * | 4/2002 | Ikeda et al. | ................. | 438/738 |
| 2002/0084257 A1 * | 7/2002 | Bjorkman et al. | ............. | 216/72 |
| 2003/0040192 A1 * | 2/2003 | Kanegae | ..................... | 438/710 |
| 2003/0176058 A1 * | 9/2003 | Weidman et al. | ............ | 438/638 |
| 2004/0067635 A1 | 4/2004 | Wu et al. | ..................... | 438/624 |
| 2004/0121265 A1 * | 6/2004 | Werner et al. | ............... | 430/311 |
| 2004/0127016 A1 | 7/2004 | Hoog et al. | .................. | 438/637 |
| 2004/0214430 A1 * | 10/2004 | Ruelke et al. | ............... | 438/687 |

(Continued)

*Primary Examiner*—W. David Coleman
*Assistant Examiner*—Maliheh Malek
(74) *Attorney, Agent, or Firm*—Williams, Morgan & Amerson, P.C.

(57) ABSTRACT

In an etch process for forming via openings and trench openings in a low-k dielectric layer, the material removal of an underlying etch stop layer is decoupled from the etching through the low-k dielectric in that the reduction in thickness is substantially achieved during the resist removal. For this purpose, the resist plasma etch may correspondingly be controlled to obtain the desired target thickness of the etch stop layer, wherein fluorine may be provided from an external source and/or fluorine may be generated in a controlled manner from polymer layers deposited within the etch chamber.

17 Claims, 4 Drawing Sheets

U.S. PATENT DOCUMENTS

| | | | |
|---|---|---|---|
| 2005/0032354 A1* | 2/2005 | Chu et al. | 438/636 |
| 2005/0079703 A1* | 4/2005 | Chen et al. | 438/633 |
| 2005/0255695 A1* | 11/2005 | Shimada | 438/637 |
| 2005/0282382 A1* | 12/2005 | Ko et al. | 438/637 |
| 2006/0046495 A1* | 3/2006 | Frohberg et al. | 438/706 |
| 2006/0073697 A1* | 4/2006 | Wang et al. | 438/623 |
| 2006/0105567 A1* | 5/2006 | Ramachandrarao et al. | 438/637 |
| 2006/0154471 A1* | 7/2006 | Minami | 438/618 |
| 2006/0189144 A1* | 8/2006 | Krawczyk et al. | 438/710 |
| 2006/0258160 A1* | 11/2006 | Tabaru | 438/710 |
| 2007/0123009 A1* | 5/2007 | Richter et al. | 438/479 |
| 2007/0178699 A1* | 8/2007 | Schaller et al. | 438/689 |
| 2009/0194845 A1* | 8/2009 | Werner et al. | 257/532 |
| 2009/0243116 A1* | 10/2009 | Feustel et al. | 257/773 |
| 2009/0273086 A1* | 11/2009 | Bartsch et al. | 257/758 |

* cited by examiner

TECHNIQUE FOR ENHANCING PROCESS FLEXIBILITY DURING THE FORMATION OF VIAS AND TRENCHES IN LOW-K INTERLAYER DIELECTRICS

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material having a low permittivity to enhance device performance.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and also include a plurality of inter-level connections, also referred to as vias, filled with an appropriate metal. The vias provide electrical connection between two neighboring stacked metallization layers, wherein the metal-containing lines and vias may also be commonly referred to as interconnects.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers may increase and the dimensions of the individual lines and vias may be reduced as the number of circuit elements per chip area becomes larger. The fabrication of a plurality of metallization layers entails extremely challenging issues to be solved, such as mechanical, thermal and electrical reliability of a plurality of stacked metallization layers. As the complexity of integrated circuits advances and brings about the necessity for conductive lines that can withstand moderately high current densities, semiconductor manufacturers are increasingly replacing the well-known metallization metal aluminum with a metal that allows higher current densities and hence allows a reduction in the dimensions of the interconnections and thus the number of stacked metallization layers. For example, copper and alloys thereof are materials that are used to increasingly replace aluminum due to their superior characteristics in view of higher resistance against electromigration and significantly lower electrical resistivity when compared with aluminum.

Despite these advantages, copper and copper alloys also exhibit a number of disadvantages regarding the processing and handling in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called damascene technique (single and dual) is therefore preferably used wherein a dielectric layer is first applied and then patterned to receive trenches and/or vias, which are subsequently filled with copper or copper alloys.

The process of filling copper or copper alloys into highly scaled openings, such as trenches or vias having aspect ratios (depth/diameter) of approximately 5 or even more for sophisticated integrated circuits, is an extremely challenging task for process engineers. As previously noted, copper and its respective alloys may not efficiently be deposited by chemical or physical vapor deposition and hence copper-based metals are typically deposited by electrochemical techniques, such as electroless plating or electroplating. Although electroplating techniques for depositing copper are well established in the field of manufacturing integrated circuit boards, completely new deposition techniques have been developed for the formation of copper-based metallization layers in accordance with the damascene technique regarding the fill behavior during the copper deposition, in which trenches and vias are filled substantially from bottom to top with a minimum number of defects, such as voids within the trenches and vias. After the deposition of the copper or copper-based metal, the excess material deposited on areas outside of the trenches and vias has to be removed, which is currently accomplished by chemical mechanical polishing (CMP), possibly in combination with electrochemical etch techniques. In highly advanced semiconductor devices, the dielectric material, in which the copper-based metal is embedded, typically comprises a so-called low-k material, that is a material having a relative permittivity significantly lower than that of "conventional" dielectric materials, such as silicon dioxide, silicon nitride and the like, so that in general the relative permittivity of the low-k material is 3.0 or even less. However, the reduced permittivity usually comes along with a significantly reduced mechanical strength and stability and different etch properties compared to the standard materials. Therefore, in typical damascene techniques for forming low-k metallization layers of advanced semiconductor devices, a capping layer is provided that ensures the mechanical integrity of the low-k dielectric material, thereby acting as a polish stop layer during the removal of the excess metal.

It turns out that the process of etching vias and trenches in the low-k dielectric layer may significantly affect the overall damascene process flow and may also have an impact on the finally obtained copper-based connection. With reference to FIGS. 1a-1d, a typical conventional process flow will now be described in more detail to more clearly demonstrate the problems involved in forming highly scaled metal lines in a low-k dielectric material.

FIG. 1a schematically shows a cross-sectional view of a semiconductor device 100 comprising a substrate 101, which may be provided in the form of a bulk silicon substrate, a silicon-on-insulator (SOI) substrate and the like, wherein the substrate 101 may also represent a device layer having formed therein individual circuit elements, such as transistors, capacitors, lines, contact portions and the like. For convenience, any such circuit elements are not shown in FIG. 1a.

The device 100 further comprises a dielectric layer 102 formed above the substrate 101, wherein the layer 102 may represent a dielectric material enclosing the individual circuit elements, or the layer 102 may represent a portion of a lower-lying metallization layer, in which any metal filled vias (not shown) may be embedded. Depending on the specific design of the device 100, or the function of the layer 102, it may be comprised of a conventional dielectric material such as silicon dioxide, silicon nitride, or may comprise a low-k dielectric material such as, for instance, hydrogen-enriched silicon oxycarbide (SiCOH). A metal line 103 is formed above the substrate 101 and at least partially within the layer 102. The metal line 103 may be comprised of a copper-containing metal including conductive barrier layers (not shown) to enhance adhesion of the metal line to the surrounding material and reduce diffusion of copper into sensitive device regions. An etch stop layer 104 is formed on the dielectric layer 102 and the metal line 103, wherein the etch stop layer may be comprised of a material that exhibits a high etch selectivity to the material of a low-k dielectric layer 105 formed on the etch stop layer 104. Furthermore, the etch stop layer 104 typically acts as a diffusion barrier between the metal line 103 and neighboring materials to reduce the out-diffusion of metal, such as copper, and diffusion of dielectric material into the metal line 103. Moreover, the condition of an interface between the etch stop layer 104 and the metal line 103 may significantly affect the electric characteristics of the metal line 103 with respect to electromigration. Frequently, silicon nitride is used as material for the etch stop layer 104, when the moderately high permittivity thereof is considered appropriate for the device 100, whereas silicon carbide or nitrogen-enriched silicon carbide is often used in speed critical applications requiring a low overall permittivity of the layers 105, 104 and 102.

Formed on the low-k dielectric layer 105, which may be comprised of any suitable low-k dielectric, is an ARC layer or capping layer 106, which may be formed from two or more sub-layers to achieve the desired performance with respect to the optical behavior, mechanical strength and masking characteristics. For instance, the capping layer 106 may be formed from a silicon dioxide layer, acting to impart improved mechanical strength to the low-k layer 105, followed by a silicon oxynitride layer for adapting the optical behavior and a thin silicon dioxide layer acting as a nitrogen barrier for a resist mask 107 formed on the capping layer 106.

A typical process flow for forming the semiconductor device 100 as shown in FIG. 1a may comprise the following processes. After the completion of any circuit elements within the substrate 101, the dielectric layer 102 may be deposited by well-established deposition recipes based on plasma enhanced chemical vapor deposition (PECVD). For example, the layer 102 may be comprised of silicon dioxide, fluorine-doped silicon dioxide or SiCOH and, hence, deposition recipes on the basis of appropriate precursors may be employed to form the layer 102. Then, the metal line 103 may be formed in accordance with processes as will be described in the following with reference to the layer 105. Thereafter, the etch stop layer 104 is deposited by, for instance, well-established PECVD with a thickness that is sufficient to reliably stop a via etch process to be performed later on. Next, the low-k dielectric layer 105 is formed by CVD or spin coating, depending on the material used. Then, the capping layer 106 is formed by PECVD techniques on the basis of well-established recipes to provide the desired characteristics in the further processing of the device 100. Finally, the resist mask 107 may be formed by advanced photolithography to form a respective opening 107a, which may represent the dimensions of a via to be formed down to the metal line 103, or a trench as is typically formed as a boundary of a die region, as will be shown in more detail in FIG. 1c.

FIG. 1b schematically depicts the device 100 with an opening 105a formed in the layer 106, the low-k dielectric layer 105 and partially in the etch stop layer 104. For this purpose, an anisotropic etch process is performed wherein, in an initial phase, the exposed portion of the layer 106 is removed and, in a subsequent process, the low-k dielectric material is removed to form the opening 105a, which in FIG. 1b may represent a via opening, while at the periphery the opening 105a may represent a trench.

FIG. 1b further shows a cross-sectional view of the device 100 at the boundary of a die region, wherein a metal trench is to be formed that separates an inner die region from a so-called open area. Thus, an opening 105b represents a trench that is aligned to a lower metal line 103a.

It should be noted that the anisotropic etch process is performed to simultaneously form the openings 105a and 105b representing a via opening and a trench, respectively. During this anisotropic process, the initial phase for etching through the layer 106 may require a different etch chemistry compared to the main etch for removing the low-k dielectric material of the layer 105 due to differences in material composition, density and the like. Typically, an etch chemistry on the basis of carbon and fluorine is used during the main etch step, which usually produces fluorine-containing polymers that may deposit on walls of an etch chamber, on the substrate and the like. Moreover, when the etch front reaches the etch stop layer 104, material thereof is also removed, even though at a significantly lower removal rate compared to the material of the layer 105. However, the different kinetic conditions within the via opening 105a and the trench opening 105b, as well as a certain non-uniformity across the entire substrate 101 and from substrate to substrate, require a very high etch selectivity between the etch stop layer 104 and the low-k dielectric layer 105 to reliably stop the etch process without exposing some of the metal lines 103 and 103a to the etch ambient and without necessitating an undue thickness of the etch stop layer 104, which might compromise the overall permittivity of the layer stack. As a consequence, it is very difficult to finely tune a remaining thickness 104a of the layer 104 in the opening 105a and the thickness 104b of the layer 104 in the opening 105b during the anisotropic etch process, thereby contributing to undesired process variations in a subsequent process for etching through the remaining etch stop layer 104 having the reduced thickness 104a and 104b. Next, the resist mask 107 is removed by means of an oxygen plasma.

FIG. 1c schematically illustrates the device 100 in an advanced manufacturing stage at a location on the substrate 101 that relates to the via opening 105a and the trench opening 105b. The device 100 now comprises a resist mask 109 having formed therein a trench 109a above the opening 105a with dimensions corresponding to design dimensions of a trench to be formed around the via opening 105a. The resist mask 109 further comprises a trench 109b formed above the trench opening 105b in accordance with the dimensions thereof. Moreover, a fill material 108 is formed underneath the resist mask 109, wherein the fill material 108 is also provided within the openings 105a and 105b. The fill material may be comprised of a photoresist of different type compared to the resist mask 109, or the fill material 108 may represent any other polymer material that may be applied in a low viscous state to fill the openings 105a and 105b while providing a substantially planar surface. The fill material 108 may also serve as an ARC layer during the patterning of the resist mask 109.

The resist mask 109 may be formed by first applying the fill material 108 by, for example, spin coating a resist or a polymer material and then applying a photoresist by spin coating and performing a well-established photolithography process and etching the fill material 108 on the basis of the resist mask 109. Thereafter, the device 100 is subjected to an etch ambient 110 on the basis of carbon and fluorine to etch through the layer 106 and remove a portion of the layer 105 to form a trench around the via opening 105a while the resist mask 109 and the fill material 108 at the trench opening 105b prevent substantial material removal. Moreover, the fill material 108 within the openings 105a and 105b, although also partially removed during the etch process 110, protects the remaining etch stop layer 104 so that the metal lines 103 and 103a are not exposed to the etch ambient 110. After a trench of specified depth is formed around the via opening 105a, the resist mask 109 and the fill material 108 are removed by, for instance, an oxygen-based plasma treatment.

FIG. 1d schematically shows the device after the above process sequence with a trench 111 formed in the layer 106 and the low-k dielectric layer 105 around the via opening 105a. Moreover, the device is subjected to a further etch process 112 to remove the remaining etch stop layer 104 having the reduced thickness 104a and 104b (FIG. 1b). During the etch process 112 requiring a carbon- and fluorine-based etch recipe, upper portions 111a of the trenches 111 and 105b are permanently exposed to the etch ambient 112, thereby creating a certain amount of edge rounding, which may in many applications be undesirable owing to the risk of trench "bridging" of closely spaced trenches 111 when filled with a metal. As previously pointed out, the remaining etch stop layer 104 has reduced thicknesses 104a and 104b resulting from the etch process performed to form the via opening 105a and trench opening 105b. Hereby, the controllability of the etch process is moderately poor due to different kinematic conditions in the trench 105b and the opening 105a, across-substrate non-uniformities and the like. Consequently, the reduced thicknesses 104a and 104b have to be selected sufficiently high to reliably prevent etching through the etch stop layer 104, thereby damaging the underlying metal lines 103 and 103a. However, the moderately high and not very well-controlled thicknesses 104a and 104b require the etch process 112 to be performed sufficiently long to reliably expose the metal lines 103 and 103a, thereby also causing undue edge rounding at the upper trench portions 111a.

In view of the situation described above, there exists a need for an improved technique which solves or at least reduces the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables, in some illustrative embodiments, the formation of vias and trenches in a low-k dielectric layer at increased controllability of the involved etch processes, thereby providing the potential for reducing edge rounding of upper portions of metal trenches formed in low-k dielectrics.

According to a further illustrative embodiment, a method comprises forming a resist mask above a dielectric layer stack comprising a low-k dielectric layer formed on an etch stop layer, wherein the dielectric layer stack is formed on a substrate. Then, an opening is etched through the low-k dielectric material and to the etch stop layer based on a first plasma ambient of a first etch chemistry that is selective with respect to the low-k dielectric layer and the etch stop layer. Next, the resist mask is removed on the basis of a second oxygen-containing plasma ambient of a second etch chemistry, wherein the second etch chemistry includes, at least after an initialization phase, an etchant that removes material of the etch stop layer. Finally, the second etch chemistry is maintained to reduce a thickness of the etch stop layer corresponding to a predefined target thickness.

BRIEF DESCRIPTION OF THE DRAWINGS

The invention may be understood by reference to the following description taken in conjunction with the accompanying drawings, in which like reference numerals identify like elements, and in which.

Figure 1A:
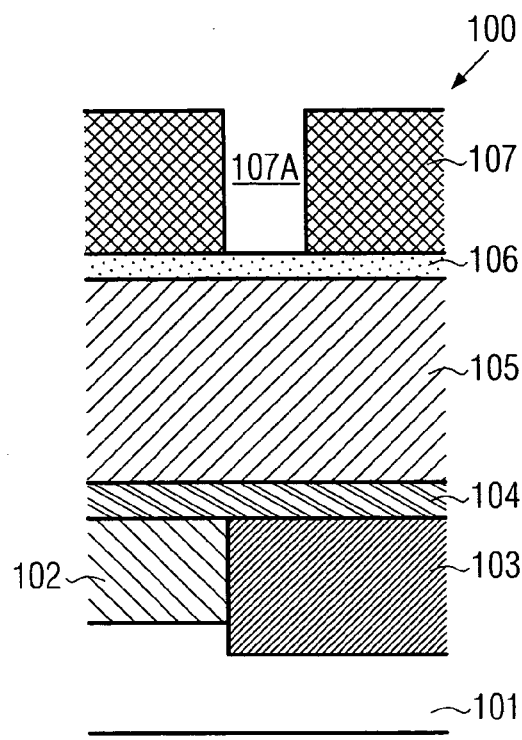
FIGS. 1a-1d schematically illustrate a semiconductor device during various manufacturing stages in forming trenches and vias in a low-k dielectric layer according to a typical conventional process flow.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the finding that process flexibility and process margin in forming vias and trenches in low-k metallization layers may be improved in that respective etch steps for forming a via opening and/or trench openings in a low-k dielectric down to an etch stop layer are performed substantially independently from each other rather than attempting to further increase the selectivity between the material of the etch stop layer and the low-k dielectric material. For this purpose, the resist removal step performed after the main etch step through the low-k dielectric is appropriately designed to also remove material of the etch stop layer in a highly controllable manner, thereby enabling the removal of an increased portion of the etch stop layer compared to conventional approaches without risking undue damage of the underlying material. The highly controllable removal of material of the etch stop layer may be accomplished by controlling the amount of fluorine within an oxygen-based plasma atmosphere, which is also used for removing the resist mask. Contrary to the highly reactive etch chemistry during the main etch through the low-k dielectric, the fluorine-containing plasma atmosphere used for the resist removal exhibits a reduced etch rate for the etch stop layer and thus allows a significantly higher control compared to the conventional technique, in which extended etching after substantially having removed the low-k dielectric may result in damaging the underlying material, that is, unintentionally locally etching through the etch stop layer, due to the high degree of non-uniformities, i.e., different propagation speeds of the etch front, created during the preceding etching through the thick low-k dielectric. Due to the reduced etch rate and the moderately low fluorine concentration, kinematic differences in etching deep trenches and high aspect ratio via holes may be less pronounced, thereby also contributing to an enhanced overall controllability of the etch process. Hence, the remaining thickness of the etch stop layer that is to be opened in a final etch process may be selected substantially independently from process specifics of the main etch step, thereby reducing edge rounding during the final etch step.

Figure 1B:
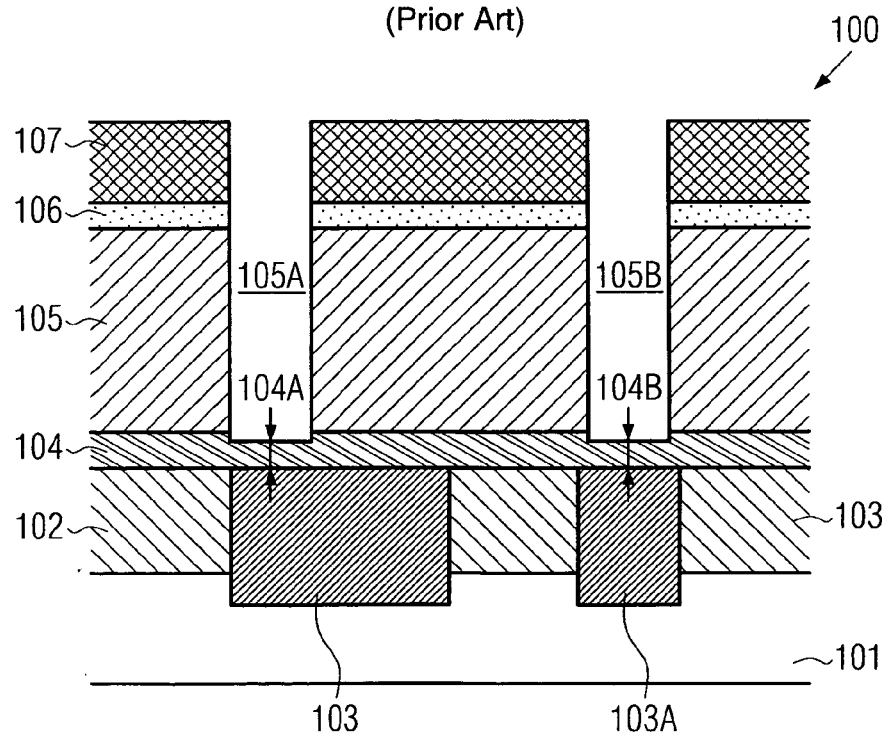
Figure 1C:
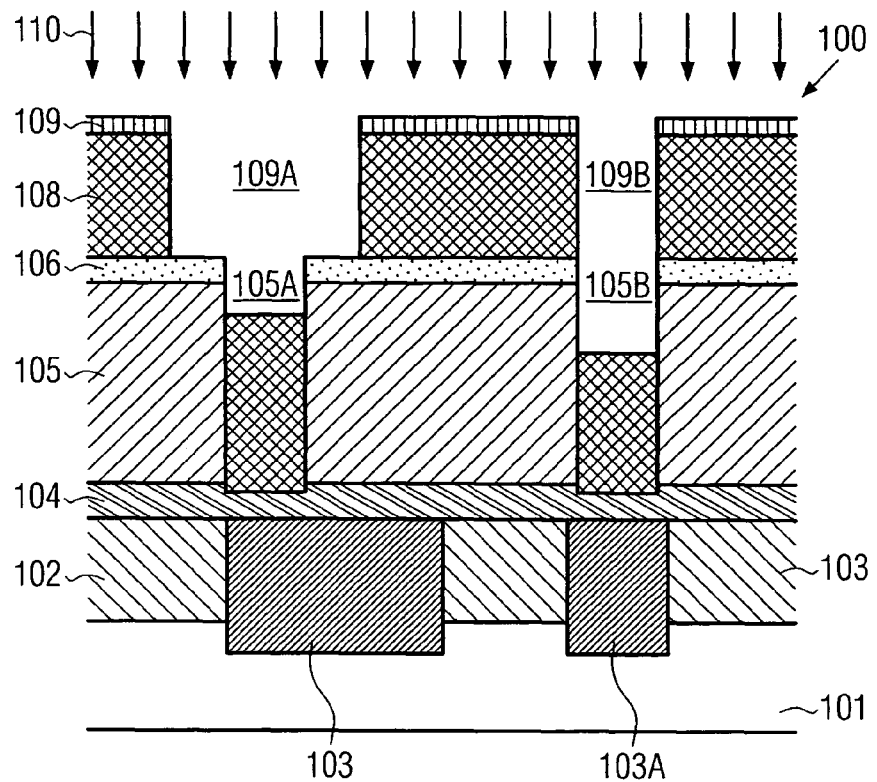
Figure 2A:
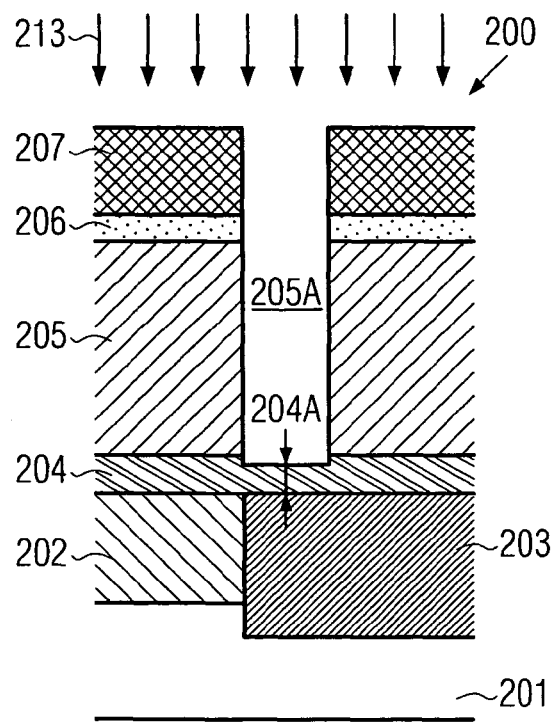
FIGS. 2a-2d schematically illustrate a semiconductor device during various manufacturing stages in forming trenches and vias in a low-k dielectric layer, wherein a via etch step is substantially decoupled from adjusting a remaining thickness of an etch stop layer according to illustrative embodiments of the present invention.

With reference to FIGS. 2a-2d, further illustrative embodiments of the present invention will now be described in more detail. FIG. 2a schematically shows a cross-sectional view of a semiconductor device 200 during a manufacturing stage similar to the device 100 of FIG. 1b. Thus, the device 200 comprises a substrate 201, which may be provided in the form of a bulk silicon substrate, an SOI substrate and the like, wherein the substrate 201 may also represent a device layer having formed therein individual circuit elements, such as transistors, capacitors, lines, contact portions and the like. For convenience, any such circuit elements are not shown in FIG. 2a. The device 200 further comprises a dielectric layer 202 formed above the substrate 201, wherein the layer 202 may represent a dielectric material enclosing the individual circuit elements, or the layer 202 may represent a portion of a lower-lying metallization layer, in which any metal filled vias (not shown) may be embedded. Depending on the specific design of the device 200, or the function of the layer 202, it may be comprised of a conventional dielectric material such as silicon dioxide, silicon nitride, or may comprise a low-k dielectric material such as, for instance, hydrogen-enriched silicon oxycarbide (SiCOH), porous silicon dioxide, known as SILK, or low-k polymer materials, such as HSQ, MSQ and the like. In this specification, as well as in the claims, a low-k dielectric material is to be understood as a dielectric material having a relative permittivity of 3.0 or less.

A conductive line 203 is formed above the substrate 201 and at least partially within the layer 202. The conductive line 203 may be comprised of a variety of conductive materials, such as, for example, a copper-containing metal including conductive barrier layers (not shown) to enhance adhesion of the conductive line 203 to the surrounding material and reduce diffusion of copper into sensitive device regions. An etch stop layer 204 is formed on the dielectric layer 202 and the line 203, wherein the etch stop layer 204 may be comprised of a material that exhibits a high etch selectivity to the material of a low-k dielectric layer 205 formed on the etch stop layer 204. Furthermore, the etch stop layer 204 typically acts as a diffusion barrier between the line 203 and neighboring materials to reduce the out-diffusion of metal, such as copper, and diffusion of dielectric material into the metal line 203. In some embodiments, silicon nitride may be used as material for the etch stop layer 204, when the moderately high permittivity thereof is considered appropriate for the device 200, whereas, in other embodiments, silicon carbide or nitrogen-enriched silicon carbide may be used in speed critical applications requiring a low overall permittivity of the layers 205, 204 and 202.

Formed on the low-k dielectric layer 205, which may be comprised in one illustrative embodiment of SiCOH, while in other embodiments SILK, HSQ, MSQ and the like may be used, is an ARC layer or capping layer 206, which may be formed from two or more sub-layers to achieve the desired performance with respect to the optical behavior, mechanical strength and masking characteristics. For instance, the capping layer 206 may comprises a silicon dioxide layer, formed on the low-k dielectric layer 205 acting to impart improved mechanical strength thereto, followed by a silicon oxynitride layer for adapting the optical behavior and a thin silicon dioxide layer acting as a nitrogen barrier for a resist mask 207 formed on the capping layer 206. In other embodiments, the capping layer 206 may be designed on the basis of silicon dioxide and carbon to provide the desired optical and mechanical characteristics without using nitrogen in the layer 206 and/or during the formation of the layer 206, thereby reducing the risk of resist poisoning.

A via opening 205a is formed in the capping layer 206 and the low-k dielectric layer 205, wherein the via opening 205a extends down to and slightly into the etch stop layer 204, thereby forming a thickness 204a. It should be appreciated that the thickness 204a is greater than the thickness 104a of the conventional device 100 (FIG. 1b), since an etch process for etching through the low-k dielectric layer 205 may be stopped when the etch stop layer is reliably reached across the entire substrate 201, as will be described in the following, as no further etching is required for further removing material of the etch stop layer 204, other than in the conventional case.

A typical process flow for forming the device 200 as depicted in FIG. 2a may comprise substantially the same processes as are described with reference to the device 100 in FIGS. 1a and 1b. In particular, an anisotropic etch process 213 for etching through the low-k dielectric layer 205 is performed on the basis of well-known recipes including fluorine and carbon or fluorine, carbon and hydrogen compounds, wherein, contrary to the conventional approach, the etch process 213 is stopped upon reaching the etch stop layer 204 or after removal of only a reduced portion thereof. A corresponding controlled end of the etch process 213 may be accomplished on the basis of endpoint detection, which optically detects specific volatile components in the etch ambient, when the material of the etch stop layer 204 is removed. It should be appreciated that exposing of the etch stop layer 204 in all via openings 205a across the substrate 201, or in deep trenches in a die boundary region (not shown), such as the trench opening 105b in FIG. 1b, is less critical, since a further etch step designed to remove both the resist mask 207 and additional material of the etch stop layer 204 will be performed afterwards. During this etch step, any residues of the layer 205 that may have not been etched may also be reliably removed in the subsequent process for removing the resist mask 207 and reducing the etch stop layer 204. Thus, contrary to conventional processes, the etch process 213 may be stopped on the basis of process requirements of the process 213 without requiring any extended over-etch times as a compromise between reliable material removal of the layer 205, etch stop layer reduction and avoiding damage of the underlying metal line 203.

As previously explained, during the etch process 213, the volatile byproducts may form fluorine-containing polymers, which may deposit on process chamber surfaces, the backside of the substrate 201, while the polymer material is substantially prevented from depositing on the resist mask 207 by the ongoing particle bombardment of the etch process 213.

Figure 2B:
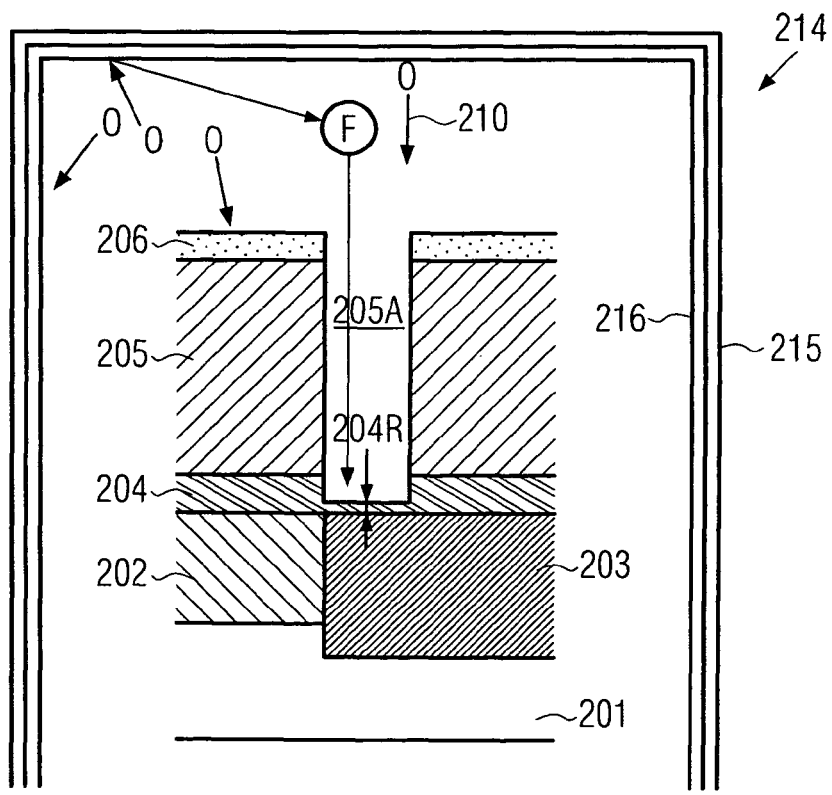

FIG. 2b schematically depicts the device 200 in a further stage after completion of the etch process 213. In one particular embodiment, the substrate 201 is kept in an etch chamber 214, which has previously been used for the etch process 213. Thus, exposed chamber surfaces 215 may have formed thereon a fluorine-containing polymer material 216. A plasma ambient 210 is established within the chamber 214, wherein the plasma ambient comprises oxygen, which is typically used for resist ashing, the volatile byproducts of which are then removed. During the etch process 210, also the polymer material 216 is attacked and dissolved, thereby liberating fluorine, which enters the plasma ambient to generate an etch chemistry that also enables removal of the material of the etch stop layer 204. The fluorine "production" rate may be controlled by process parameters for controlling the plasma ambient 210. That is, the amount of oxygen supplied to the chamber 214 and/or the excitation energy for generating a plasma and/or the pressure and/or the substrate temperature and/or a bias power may be controlled to obtain a desired fluorine production rate and thus a desired removal rate for the etch stop layer 204. In some embodiments, a conventional recipe for resist removing may be used, wherein, other than in the conventional process, the plasma ambient 210 is maintained after removal of the resist mask 207 until a desired amount of material is removed in order to obtain a reduced thickness 204r corresponding to a target value. Hereby, an appropriate "over-etch" time may be estimated on the basis of test runs, in which, for example, the removal rate of the etch stop layer for a specified etch recipe for the process 210 is determined in advance.

In this case, in some embodiments, the test structure may comprise similar or identical via openings and/or trench openings so that pattern dependent influences may be taken into account. In other embodiments, at least one of the process parameters specified above may be controlled such that the duration of the removing of the resist mask 207 is comparable to the duration of removing a desired amount of the etch stop layer 204. For example, the plasma of the ambient 210 may be adjusted to create a sufficient ion bombardment for liberating a moderately high amount of fluorine. In this way, the removal rate for the etch stop layer 204 may be increased so that no extended etch time after complete removal of the resist mask is required, thereby reducing the time period for exposure of the layer 206 to the fluorine-containing etch chemistry when the resist mask is completely removed. Consequently, edge rounding at upper portions of a deep trench, such as the trench 105b, may be kept at a low level. Appropriate process parameters may also be established on the basis of suitable test structures processed under varied conditions for the etch process 210. In one embodiment, a typical commercially available plasma etcher may be used, wherein the following parameters may be used to obtain the reduced thickness 204 in the range of approximately 5-20 nm with a total process time of the etch process 210 for removing the resist and the required portion of the etch stop layer 204:

RF power: approximately 150-500 W;
bias power: approximately 50-200 W;
oxygen flow rate: approximately 200-800 sccm;
pressure: approximately 10-100 milliTorr; and
substrate temperature: approximately 0-100° C.

It should be appreciated that the above parameters strongly depend on the specifics of the etch tool used. For example, specific "deposition" surfaces may be provided within the chamber 214 to allow a certain degree of control of depositing fluorine-containing polymers and liberating the fluorine during the process 210. To this end, cooled surface portions may be positioned at dedicated locations to promote polymer deposition thereon, while at the same time obtaining a locally increased fluorine concentration in the vicinity of the substrate 201. Appropriate parameters for the etch process 210 for any other plasma etch tool and chamber configurations may, however, readily be deduced on the basis of the above-specified parameter ranges and/or corresponding test runs may be performed to relate at least one etch parameter to a finally desired reduced thickness 204r. Consequently, by removing the essential amount, for example approximately 50-90%, of material of the etch stop layer 204 during the etch process 210 rather than during the main etch through the dielectric layer 205, adjusting of the reduced thickness 204r is substantially "decoupled" from the main etch process so that well-approved etch recipes may be applied without requiring continuous attempts in obtaining even more increased etch selectivity to improve the overall controllability. Moreover, the main etch process for forming the via opening 205a and any trenches at the die boundary may be adapted to process and device requirements, such as the employment of different material compositions of the layer 205, substantially without affecting the process 210.

Figure 2C:
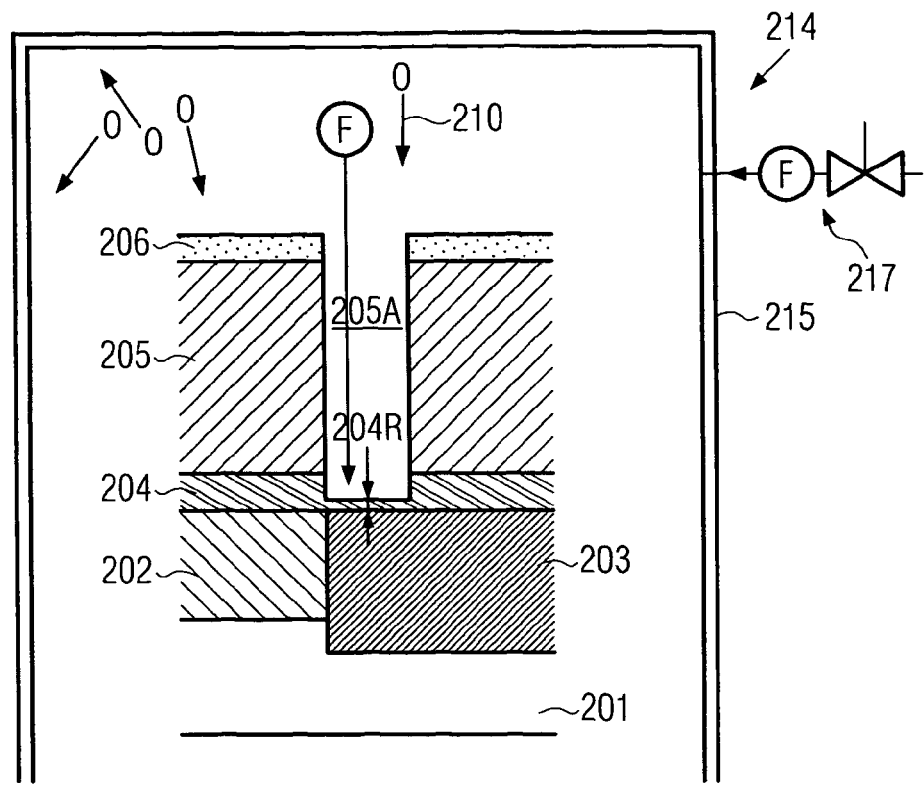

FIG. 2c schematically illustrates the device 200 during the etch process 210 according to other illustrative embodiments. The device 200 may be positioned in the etch chamber 214, wherein the etch chamber 214 may substantially lack the polymer material 216 deposited on exposed surfaces. For example, the main etch process for forming the via opening 205a may have been performed in a separate chamber, or the chamber 214 may be cleaned prior to the process 210 to provide well-defined process conditions with respect to the fluorine contents during the etch process 210.

In other illustrative embodiments, the process chamber 214 may be in a similar condition as shown in FIG. 2c, that is, the fluorine-containing polymer layer 216 may be formed on exposed surfaces. Moreover, the chamber 214 comprises a gas supply 217 that is configured to enable a controlled supply of fluorine-containing gases, such as $CF_4$, $CHF_3$, $CH_2F_2$, and the like. Consequently, the oxygen-containing plasma ambient required for removing the resist mask 207 may receive a precisely controlled amount of fluorine by means of the supply 217, wherein an enhanced flexibility is achieved regarding the etch process 210. That is, by alternatively or additionally supplying a fluorine-containing gas via the supply 217, the process 210 may be controlled even more efficiently compared to the embodiments described with reference to FIG. 2b, as the etch behavior with respect to the etch stop layer 204 may to a certain degree be decoupled from the etch behavior of the resist mask 207. For example, the amount of fluorine may be increased compared to the case where the fluorine is solely generated by the oxygen plasma and/or the gas may be supplied in a time-dependent fashion. For instance, when the resist removal process is performed according to well-known parameters requiring a specified amount of time, whereas a higher material removal has been determined for the material of the etch stop layer 204 for a specified well-controllable flow rate, the fluorine-containing gas may be supplied after an initial phase of the etch process 210 to obtain the reduced thickness 204r within a desired time period, for example, approximately at the time when the resist mask is substantially completely removed.

In other cases, the thickness reduction of the etch stop layer may be performed during a first period of the process 210 and, thereafter, the supply of fluorine-containing gas may be discontinued, while the resist removal is still continuing. In other embodiments, other control strategies may be used, such as providing the fluorine-containing gas after an initial phase and discontinuing the supply prior to a final phase of the process 210, intermittently supplying the fluorine-containing gas to achieve a desired averaged concentration, and the like.

In any of the above procedures, at least one process parameter is controlled to obtain the reduced thickness in accordance with a predefined target value. With respect to obtaining an appropriate value for the at least one process parameter, the same criteria apply as previously explained with reference to FIG. 2b. For example, the removal rate for the etch stop layer 204 on the basis of one or more predetermined resist removal recipes may be determined by experiment for various flow rates and process times for the fluorine-containing gas. From these results, an appropriate flow rate and a respective duration for the supply of the fluorine-containing gas may be selected. In these measurements, the chamber-specific and pattern-specific characteristics may also be taken account of in that similar test structures are used and a chamber is employed that has experienced substantially the same process "history" as the chamber 214 in the actual etch process 210. In a typical example, a flow rate of approximately 10-50 sccm of $CF_4$ for the above-identified etch tool with similar process parameters as given above, the etch stop layer 204 comprised of silicon carbide with an initial thickness of approximately 50 nm is reduced to approximately 5-20 nm in approximately 5-15 seconds of gas supply.

It should be appreciated that other parameter values may readily be established based on the above parameters and the finding that the etch process 210 may be designed to remove the resist mask 207 and also provide the desired thickness 204r, wherein the additional or alternative supply of fluorine-containing gas allows also an efficient decoupling of the resist removal and the thickness reduction.

Figure 1D:
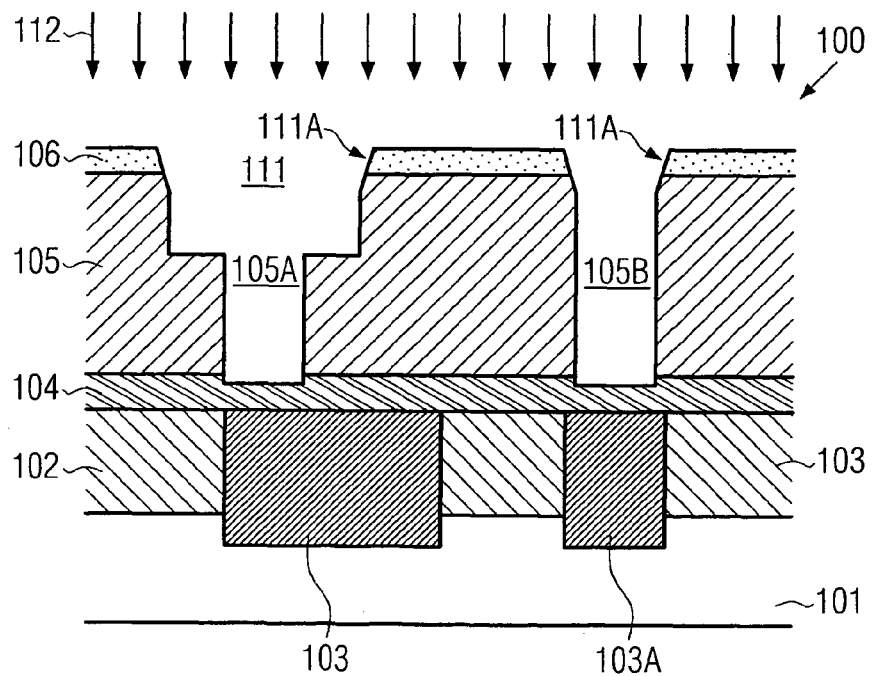
Figure 2D:
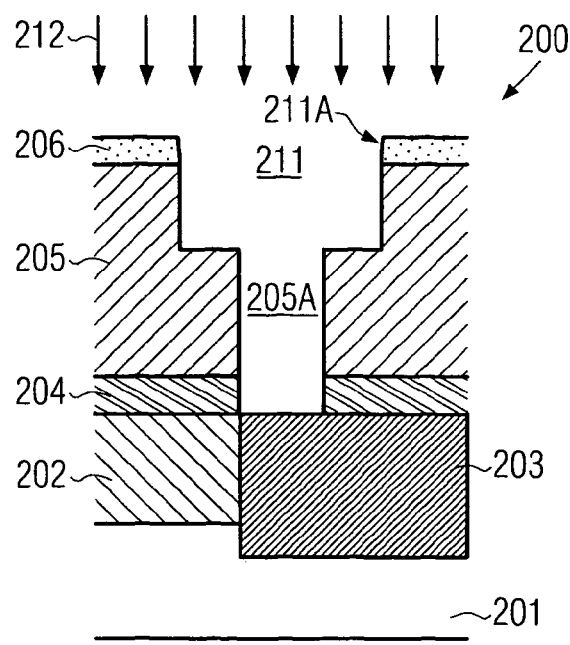

FIG. 2d schematically illustrates the device 200 in a further advanced manufacturing stage. A trench 211 is formed around the via opening 205a, wherein upper portions 211a of the trench 211 may exhibit a significantly reduced edge rounding compared to the conventionally manufactured device 100 of FIG. 1d. The process of forming the trench 211 may be performed in a similar manner as is also described with reference to FIG. 1d. However, contrary to the conventional process, the removal of the remaining etch stop layer 204 having the reduced thickness 204r is performed during an etch process 212, which results in a significantly reduced exposure of the layer 206 to the etch ambient due to the efficiently controlled reduced thickness 204r that may significantly be less as in the conventional case.

As a result, the present invention provides a technique that enables enhanced process flexibility and process margin in forming via openings and trenches in a low-k dielectric layer by substantially decoupling the main etch process through the low-k dielectric from a process for adapting the thickness of the etch stop layer for subsequent processes. To this end, the resist removal process performed after etching through the low-k dielectric is designed to also remove essentially the required amount of material of the etch stop layer, thereby providing enhanced controllability and thus enabling the removal of a greater portion of the etch stop layer, approximately 30-90%, compared to conventional processes. Hereby, the fluorine contained in polymers deposited on chamber walls and/or externally supplied fluorine-containing gas may be used to obtain an etch chemistry for reducing the thickness of the etch stop layer. When supplying an external fluorine-containing gas, a high degree of decoupling between the resist removal process and the etch stop layer removal may be achieved, thereby offering an even more overall controllability of the process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a resist mask above a dielectric layer stack comprising a low-k dielectric layer formed on an etch stop layer having a first thickness, said dielectric layer stack being formed on a substrate;
   etching an opening through said low-k dielectric layer and to said etch stop layer based on a first plasma ambient of a first etch chemistry that is selective to said low-k dielectric layer;
   removing said resist mask on the basis of a second oxygen-containing plasma ambient of a second etch chemistry, said second etch chemistry including, at least after an initialization phase, an etchant that removes material of said etch stop layer; and
   maintaining said second etch chemistry after removing said resist mask to effect a controlled reduction in a thickness of said etch stop layer corresponding to a difference between the first thickness and a predefined target thickness for the etch stop layer after exposure to said second etch chemistry.

2. The method of claim 1, further comprising controlling at least one process parameter in maintaining said second etch chemistry to control an amount of said etchant liberated from contaminants deposited on a surface of a process chamber used to establish said first and second etch chemistries.

3. The method of claim 2, wherein said contaminants comprise fluorine-containing polymers generated when etching through said low-k dielectric layer.

4. The method of claim 2, further comprising:
   prior to forming said resist mask, forming a layer of a material of said etch stop layer on a second substrate, and establishing a correlation relating a removal rate of said material of said etch stop layer to said at least one process parameter; and
   controlling said at least one process parameter on the basis of said established correlation during said maintaining said second etch chemistry.

5. The method of claim 4, wherein said at least one process parameter comprises a time period of maintaining said second oxygen-containing plasma ambient.

6. The method of claim 1, further comprising introducing, at least after said initialization phase, a fluorine-containing gas into said second oxygen-containing plasma ambient.

7. The method of claim 6, further comprising controlling at least one process parameter of said second oxygen-containing plasma ambient to reduce said thickness of said etch stop layer.

8. The method of claim 7, further comprising:
prior to forming said resist mask, forming a layer of a material of said etch stop layer on a second substrate, and establishing a correlation relating a removal rate of said material of said etch stop layer to said at least one process parameter; and
controlling said at least one process parameter on the basis of said established correlation during said maintaining said second etch chemistry.

9. The method of claim 8, wherein said at least one process parameter comprises a time period of maintaining said second oxygen-containing plasma ambient.

10. The method of claim 1, wherein said opening represents a via opening of a low-k metallization layer.

11. The method of claim 10, further comprising etching a deep trench through said low-k dielectric layer in the same etch process as said via opening.

12. The method of claim 11, further comprising forming a second resist mask to expose a portion of said dielectric layer stack, etching a shallow trench using said resist mask and removing said etch stop layer having the reduced thickness corresponding to said predefined target value.

13. The method of claim 9, wherein introducing said fluorine-containing gas is discontinued prior to having substantially completely removed said resist mask.

14. The method of claim 4, wherein said process parameter comprises a fluorine concentration of said second etch chemistry.

15. The method of claim 4, wherein controlling said at least one process parameter comprises controlling said process parameter to control a fluorine production rate.

16. The method of claim 8, wherein said process parameter comprises a fluorine concentration of said second etch chemistry.

17. The method of claim 8, wherein controlling said at least one process parameter comprises controlling said process parameter to control a fluorine production rate.

* * * * *